US012707618B2

(12) United States Patent
Nozawa

(10) Patent No.: US 12,707,618 B2
(45) Date of Patent: Aug. 11, 2026

(54) FEEDER SETUP DEVICE AND FEEDER SETUP SYSTEM

(71) Applicant: FUJI CORPORATION, Chiryu (JP)

(72) Inventor: Mizuho Nozawa, Kota-cho (JP)

(73) Assignee: FUJI CORPORATION, Chiryu (JP)

( * ) Notice: Subject to any disclaimer, the term of this patent is extended or adjusted under 35 U.S.C. 154(b) by 304 days.

(21) Appl. No.: 18/576,481

(22) PCT Filed: Jul. 14, 2021

(86) PCT No.: PCT/JP2021/026476
§ 371 (c)(1),
(2) Date: Jan. 4, 2024

(87) PCT Pub. No.: WO2023/286209
PCT Pub. Date: Jan. 19, 2023

(65) Prior Publication Data
US 2024/0314993 A1 Sep. 19, 2024

(51) Int. Cl.
*H05K 13/04* (2006.01)
*H05K 13/08* (2006.01)

(52) U.S. Cl.
CPC ....... *H05K 13/0419* (2018.08); *H05K 13/086* (2018.08)

(58) Field of Classification Search
CPC ........ B65H 49/36; B65H 67/00; B65H 67/02; B65H 67/061; B65H 67/06; B65H 67/066; B65H 67/067; B21C 47/24; H05K 13/0419; H05K 13/086; H05K 13/0417
USPC ................ 414/222.01, 225.01; 242/558, 559
See application file for complete search history.

(56) References Cited

U.S. PATENT DOCUMENTS

| | | | | |
|---|---|---|---|---|
| 5,209,247 A * | 5/1993 | Rittershaus | .............. | A24C 5/20 131/58 |
| 5,474,251 A * | 12/1995 | Neri | ..................... | B65H 19/123 242/555.2 |
| 5,487,638 A * | 1/1996 | Salsburg | ............. | B65H 19/123 414/908 |
| 6,767,318 B2 * | 7/2004 | Spatafora | ............ | B65H 19/123 493/305 |

(Continued)

FOREIGN PATENT DOCUMENTS

| | | |
|---|---|---|
| JP | 7-22776 A | 1/1995 |
| JP | 10-117090 A | 5/1998 |

(Continued)

OTHER PUBLICATIONS

International Search Report mailed on Oct. 12, 2021 in PCT/JP2021/026476 filed on Jul. 14, 2021, (2 pages).

*Primary Examiner* — Gregory W Adams
(74) *Attorney, Agent, or Firm* — Oblon, McClelland, Maier & Neustadt, L.L.P.

(57) ABSTRACT

A feeder setup device includes a feeder holding section configured to hold, at a work execution position in a vertical posture, a tape feeder to which a reel around which a carrier tape is wound is attached, the tape feeder being configured to feed the carrier tape to supply a component, a reel holding section configured to hold the reel in a lying down posture, and a reel attachment mechanism configured to take out the reel from the reel holding section, change the reel to the vertical posture, and further attach the reel to the tape feeder at the work execution position.

12 Claims, 8 Drawing Sheets

(56) References Cited

U.S. PATENT DOCUMENTS

| | | | | |
|---|---|---|---|---|
| 7,201,553 | B2 * | 4/2007 | Spatafora | B65H 16/04 414/800 |
| 7,984,603 | B2 * | 7/2011 | Freudenberg | B65H 19/123 53/389.2 |
| 9,926,160 | B2 * | 3/2018 | Macura | B65H 19/1805 |
| 2003/0219330 | A1 | 11/2003 | Lyndaker et al. | |
| 2016/0060061 | A1 * | 3/2016 | Macura | B25J 15/0047 242/559 |

FOREIGN PATENT DOCUMENTS

| | | | | |
|---|---|---|---|---|
| JP | 2005-539370 | A | | 12/2005 |
| JP | 2013-149777 | A | | 8/2013 |
| JP | 2019204858 | A | * | 11/2019 |
| WO | WO 2014/038061 | A1 | | 3/2014 |
| WO | WO 2014/118995 | A1 | | 8/2014 |
| WO | WO 2020/026619 | A1 | | 2/2020 |
| WO | WO 2021/106026 | A1 | | 6/2021 |

* cited by examiner

FEEDER SETUP DEVICE AND FEEDER SETUP SYSTEM

TECHNICAL FIELD

The present description relates to a device and a system for performing setup work of a tape feeder provided in a component mounter.

BACKGROUND ART

A technique for mass-producing board products by performing board work on a board on which a circuit pattern is formed has become widespread. A typical example of a board work machine that performs the board work is a component mounter that performs component mounting work. Many component mounters use a tape feeder that supplies components using a carrier tape. Conventionally, setup work for setting a carrier tape in a tape feeder has been performed by an operator. In recent years, techniques for automating setup work of tape feeders have been developed, and examples of the techniques are disclosed in Patent Literatures 1 and 2.

A component tape attachment device disclosed in Patent Literature 1 is intended for a component supply device that conveys a component tape (carrier tape) from a first storage section to a second storage section via a component supply position, and a robot section sets an unused component tape in the first storage section of the component supply device in a lying down posture and collects a used component tape from the second storage section. According to this, the component tape can be automatically supplied to the used component supply device.

A warehouse system disclosed in Patent Literature 2 includes a reel warehouse, a feeder warehouse, a reel loader, and a conveyance robot, the conveyance robot conveys a reel in the reel warehouse and a tape feeder in the feeder warehouse to the reel loader, and the reel loader loads the reel onto the tape feeder. According to this, the tape feeder in the component mounter is automatically prepared, the operator is not involved in the loading work, and labor saving is achieved as compared with the conventional art.

Patent Literature

Patent Literature 1: JP-A-2019-204858
Patent Literature 2: WO 2021/106026

BRIEF SUMMARY

Technical Problem

In the technique of Patent Literature 1, the unused component tape is pulled out from the reel, sent to the component supply device, and wound and held by a clip section in the first storage section. However, since it is necessary to pull out a long component tape once and rewind the component tape, the setup work becomes complicated and inefficient. In addition, since one robot section sequentially sets the unused component tape and collects the used component tape, it takes a long time to perform the setup work. In addition, in the technique of Patent Literature 1, by setting the component supply device to the lying down posture, it takes time and effort to change the component supply device to the vertical posture when the component supply device is attached to the component mounter.

In contrast, in the reel loader described in Patent Literature 2, the setup work is made efficient by performing the exchange operation of the reel around which the carrier tape is wound. However, Patent Literature 2 is related to elements of the warehouse system and the conveyance between the elements, and thus does not disclose a detailed configuration of a reel loader.

Therefore, an object of the present description is to provide a feeder setup device and a feeder setup system capable of efficiently performing setup work of a tape feeder.

Solution to Problem

According to an aspect of the present description, there is provided a feeder setup device including: a feeder holding section configured to hold, at a work execution position in a vertical posture, a tape feeder to which a reel around which a carrier tape is wound is attached, the tape feeder being configured to feed the carrier tape to supply a component: a reel holding section configured to hold the reel in a lying down posture; and a reel attachment mechanism configured to take out the reel from the reel holding section, change the reel to the vertical posture, and attach the reel to the tape feeder at the work execution position.

According to another aspect of the present description, there is provided a feeder setup system including: a feeder holding section configured to hold, at a work execution position in a vertical posture, a tape feeder to which a reel around which a carrier tape is wound is attached, the tape feeder being configured to feed the carrier tape to supply a component: a feeder accommodation section configured to accommodate multiple tape feeders in the vertical posture and detachably provided in a device housing: a feeder conveyance section configured to convey the tape feeder between the feeder accommodation section and the feeder holding section: a reel holding section configured to stack and hold multiple reels in a lying down posture and detachably provided in the device housing: a reel attachment mechanism configured to take out the reel from the reel holding section, change the reel to the vertical posture, and attach the reel to the tape feeder at the work execution position; and a conveyance vehicle configured to carry at least one of the feeder accommodation section and the reel holding section into the feeder setup device or carry out at least one of the feeder accommodation section and the reel holding section from the feeder setup device.

Advantageous Effects

In the disclosed feeder setup device and feeder setup system, the reel attachment mechanism performs setup work of changing the reel from the lying down posture to the vertical posture and attaching the reel to the tape feeder. Accordingly, the reel attachment mechanism can attach the reel held by the reel holding section in the lying down posture to the tape feeder held by the feeder holding section in the vertical posture. At this time, it is possible to easily collect the reel whose position and posture are stabilized because the reel is in the lying down posture, and thus the feeder setup device can efficiently perform the setup work. Further, since the tape feeder is set up in the vertical posture as in the case where the tape feeder is used in the component mounter, it is not necessary to convey the tape feeder after the setup by a worker or an automation device and change the posture when the tape feeder is attached to the component mounter by the worker or the automation device. Accordingly, the worker or the automation device can efficiently perform work.

DESCRIPTION OF EMBODIMENTS

Figure 1:
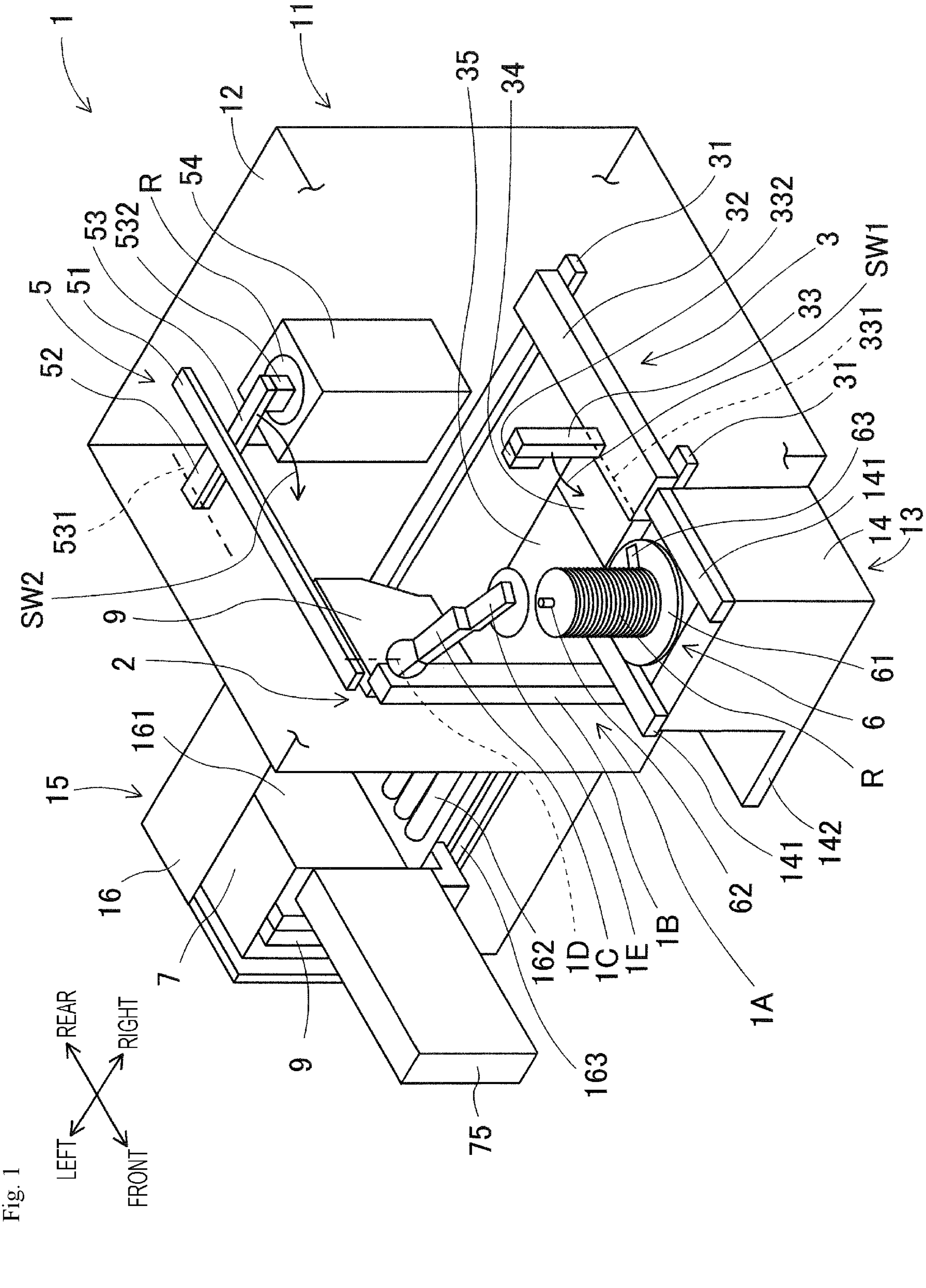
FIG. 1 is a perspective view schematically illustrating a feeder setup device according to an embodiment.

1. Configuration of Feeder Setup Device 1 of Embodiment

A configuration of feeder setup device 1 according to an embodiment will be described with reference to FIGS. 1 to 3. Each drawing is a schematic illustration view, and some members are omitted to be easily seen. As illustrated in the upper left of FIGS. 1 and 2, front, rear, left, and right directions are defined for convenience. Feeder setup device 1 includes reel attachment/detachment section 11, reel supply section 13, and feeder supply section 15.

Reel attachment/detachment section 11 is configured by assembling various members inside device housing 12. Device housing 12 is a case having a large rectangular parallelepiped shape, and a front side and a left side thereof are partially opened. Reel supply section 13 is disposed to be coupled to the front side of reel attachment/detachment section 11. Reel supply section 13 is configured by using pedestal 14 having a box shape corresponding to a device housing smaller than device housing 12. Feeder supply section 15 is disposed to be coupled to the left side of reel attachment/detachment section 11. Feeder supply section 15 is configured by using a device housing 16 which is smaller than device housing 12 and has storage space 161 in an upper portion thereof.

Reel attachment/detachment section 11 includes feeder holding section 2, reel attachment mechanism 3, tape loading mechanism 4, and reel removal mechanism 5. As illustrated in FIG. 2, feeder holding section 2 is disposed at a position close to the left front inside device housing 12. Feeder holding section 2 holds tape feeder 9 at the work execution position in the vertical posture. As illustrated in FIG. 3, feeder holding section 2 includes bottom plate 21 and support plate 23. Bottom plate 21 has groove-shaped slot 22 extending in the front-rear direction. Tape feeder 9 is inserted from the front side to the rear side of slot 22 and is held at the work execution position. Support plate 23 is provided so as to stand up from bottom plate 21 and comes into contact with the left side surface of tape feeder 9 at the work execution position. Support plate 23 supports a lateral pressing load generated when reel R is attached to tape feeder 9.

Here, an outline of a configuration of tape feeder 9 will be described with reference to FIG. 3. Tape feeder 9 is detachably mounted on a component mounter. Tape feeder 9 is attached with reel R around which carrier tape T is wound, and feeds carrier tape T to supply a component. An identification code for identifying individual reel R is displayed on each reel R.

Tape feeder 9 is thin and has a small width dimension in a left-right direction. Tape feeder 9 has reel holding shaft 91 protruding rightward from a left side plate at a substantially central position when viewed from the side. Reel holding shaft 91 is fitted into a center hole formed at a center of reel R to detachably and rotatably hold reel R. In carrier tape T, cavity sections for accommodating components are provided at a constant pitch. Further, carrier tape T is provided with multiple sprocket holes along one side edge. A central portion of right side plate 92 of tape feeder 9 is widely opened in order to facilitate attachment and detachment of reel R. There are multiple types of reels R in which the material of carrier tape T is different and the tape width dimension of carrier tape T and the width dimension of reel R are different, and there are also multiple types of tape feeders 9 corresponding to these types.

Tape feeder 9 further includes supply position 93, sprocket 94, and a tape peeling section (not illustrated). Supply position 93 is provided near the rear end of the upper surface of tape feeder 9. Sprocket 94 is rotatably provided on the front side of supply position 93. The teeth of sprocket 94 are fitted into sprocket holes of carrier tape T. Sprocket 94 is intermittently driven by a drive motor (not illustrated) and feeds carrier tape T at constant pitches. The tape peeling section causes one side edge of the cover tape constituting carrier tape T to pass through supply position 93 in a state where the one side edge is peeled off from the base tape, and enables the component to be taken out. After passing through supply position 93, carrier tape T is cut by a tape cutting device provided in the component mounter.

Further, an identification code for identifying individual tape feeder 9 is displayed on each of tape feeders 9. Tape feeder 9 is provided with a feeder control section (not illustrated). The feeder control section stores the identification code of tape feeder 9 and the identification code of reel R and controls a component supply operation. When tape feeder 9 is held by feeder holding section 2, the feeder control section is communicably connected to main control section 81, which will be described later, by automatically fitting a connector (not illustrated).

The description returns to feeder setup device 1. Reel attachment mechanism 3 is disposed on the right side of feeder holding section 2. Reel attachment mechanism 3 includes reel transfer mechanism 1A described later. Reel attachment mechanism 3 changes reel R from the lying down posture to the vertical posture, and attaches reel R to tape feeder 9 at the work execution position. Reel attachment mechanism 3 includes pair of guide rails 31, moving table 32, attachment material 33, placement area 34, temporary placement area 35, and the like. Reel attachment mechanism 3 may have a configuration in which a mechanism for changing reel R from the lying down posture to the vertical posture and a mechanism for holding reel R in the vertical posture and attaching reel R to tape feeder 9 are separated.

Pair of guide rails 31 extend in the left-right direction at a front edge position of device housing 12 and at a substantially central position in the front-rear direction, and are disposed in parallel to be separated from each other. Moving table 32 is formed of a member elongated in the front-rear direction, and is mounted over the upper sides of pair of guide rails 31. Moving table 32 reciprocates between feeder holding section 2 and a right standby position illustrated in FIGS. 1 and 2 along guide rail 31.

Attachment material 33 is formed of a member having a substantially square bar shape, and is provided to extend upward from the right side surface of moving table 32. Attachment material 33 faces reel holding shaft 91 of tape feeder 9 at the work execution position. In other words, attachment material 33 is positioned accurately in the right direction when viewed from reel holding shaft 91. Attachment material 33 swings around swing shaft 331 provided at a position close to moving table 32 between an upright posture illustrated in FIGS. 1 and 2 and a horizontal posture fell down to the left side (see arrow SW1 in FIG. 1). Collection section 332 is provided at an end portion on a side of attachment material 33 away from swing shaft 331. Collection section 332 detachably collects reel R. As collection section 332, a gripping mechanism for gripping a claw portion formed on reel R or the peripheral edge of reel R, a pickup mechanism for picking up reel R using negative pressure, or the like can be used.

Placement area 34 is provided at a position on the right side between pair of guide rails 31. Placement area 34 is an area in which reel R to be attached next is placed in the lying down posture. Temporary placement area 35 is provided on the left side of placement area 34 between pair of guide rails 31. Temporary placement area 35 is an area in which, when reel attachment mechanism 3 changes the use order of reels R, reels R are temporarily placed in the lying down posture and the use order is changed later. Reels R placed in temporary placement area 35 may not be used as a result. Temporary placement area 35 can be formed widely so that multiple reels R can be temporarily placed. Moving table 32 and attachment material 33 move above placement area 34 and temporary placement area 35.

Figure 2:
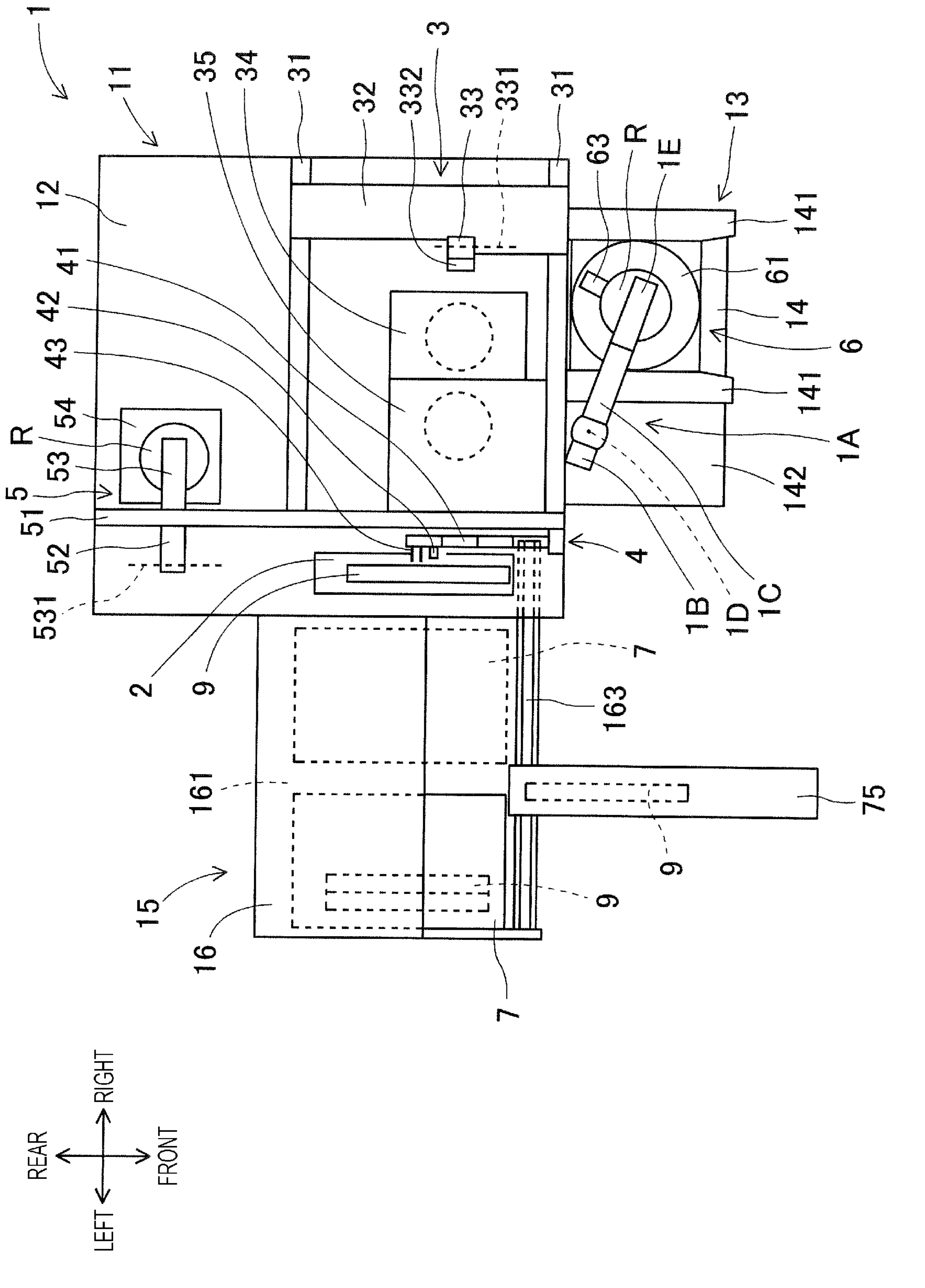
FIG. 2 is a plan view schematically illustrating the feeder setup device.
Figure 3:
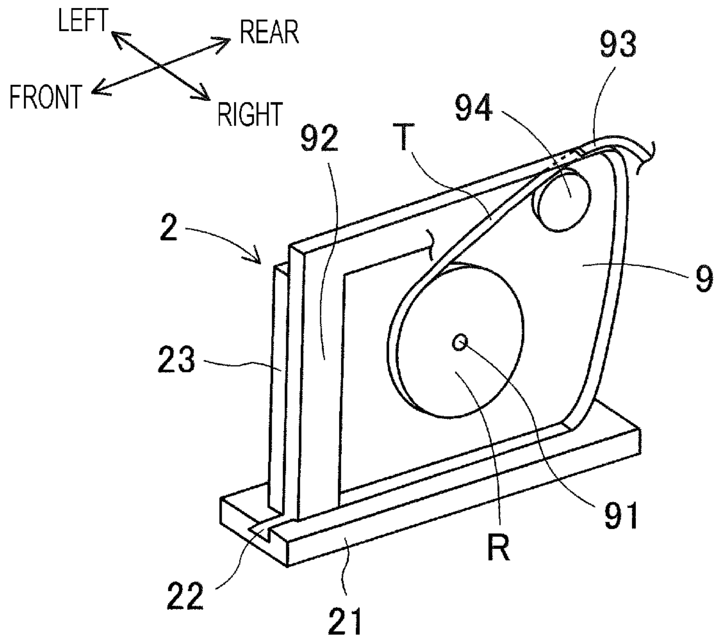
FIG. 3 is a perspective view schematically illustrating a configuration of a feeder holding section and a configuration of a tape feeder.

As illustrated in FIG. 2, tape loading mechanism 4 is disposed close to feeder holding section 2 (not illustrated in FIG. 1). Tape loading mechanism 4 loads carrier tape T in tape feeder 9 so that carrier tape T can be fed. Tape loading mechanism 4 includes, for example, an articulated robot, and includes, as a specific example, articulated arm 41, camera 42, and multiple fingers 43.

Articulated arm 41 can freely perform operations such as rotation and bending of the arm, and freely adjusts the positions and directions of camera 42 and finger 43. Camera 42 is provided at a distal end portion of articulated arm 41. Camera 42 images tape feeder 9 at the work execution position to detect the position and the state of reel R and carrier tape T. Multiple fingers 43 are provided side by side with camera 42 at the distal end portion of articulated arm 41. Multiple fingers 43 can perform a moving operation, a twisting operation, and the like in addition to the operation of gripping and releasing a work target.

Prior to the loading operation, multiple fingers 43 peel off a fastening seal fastening the distal end of carrier tape T. Next, multiple fingers 43 are loaded until the distal end of carrier tape T is engaged with sprocket 94, and are in a feedable state. Multiple fingers 43 can facilitate the peeling operation and the loading operation by rotating reel R around reel holding shaft 91 as necessary. Tape loading mechanism 4 takes a retracted posture in which articulated arm 41 is bent so as not to hinder the attaching and detaching operation of reel R in a time period other than the operation time.

Reel removal mechanism 5 is disposed on the right side of feeder holding section 2 and is located above reel attachment mechanism 3. Reel removal mechanism 5 removes reel R from tape feeder 9 at the work execution position. Reel removal mechanism 5 includes guide rail 51, moving table 52, removal material 53, and collection box 54.

Guide rail 51 is provided near the ceiling of device housing 12 and extends in the front-rear direction. Moving table 52 is formed to be long in the left-right direction and mounted on the lower side of guide rail 51. Moving table 52 reciprocates between feeder holding section 2 and a standby position on the rear side illustrated in FIGS. 1 and 2 along guide rail 51.

Removal material 53 is formed of a thick plate-shaped member longer than moving table 52, and is provided to extend in the left-right direction on the lower side of moving table 52. Removal material 53 swings around swing shaft 531 provided near the left end of moving table 52 in a horizontal posture illustrated in FIGS. 1 and 2 and a vertical posture in which removal material 53 hangs downward (see arrow SW2 in FIG. 1). Collection section 532 is provided at an end portion on the side of removal material 53 away from swing shaft 531. Collection section 532 detachably collects reel R. A collection method of collection section 532 may be the same as or different from that of collection section 332 of reel attachment mechanism 3.

Collection box 54 is disposed below removal material 53 when moving table 52 is moved to the standby position. Collection box 54 collects multiple removed reels R together. Collection box 54 is formed in a box shape opening upward. Accordingly, collection box 54 can automatically collect reel R that falls when collection section 532 of removal material 53 is released.

Reel supply section 13 detachably includes reel holding section 6, and further includes reel transfer mechanism 1A. Pair of guide plates 141 extending in the front-rear direction are provided on the left and right sides of the upper surface of pedestal 14. Reel holding section 6 is placed between pair of guide plates 141 of pedestal 14. As illustrated in FIG. 2, pair of guide plates 141 have the inner sides, which face each other on the front side, formed in a taper shape, and the separation distance on the front side is longer than that on the rear side. Accordingly, it is easy to cause reel holding section 6 to enter pedestal 14 from the front side.

Reel holding section 6 stacks and holds multiple reels R (for example, 20 reels) in the lying down posture. Note that reel R is not limited to a new one, and may be a half-used reel using carrier tape T halfway. Reel holding section 6 includes circular plate-shaped holding plate 61 that is horizontally disposed, and round rod-shaped holding shaft 62 that is provided upright upward from the center of holding plate 61 and is fitted into the center hole of reel R. Accordingly, even when reels R having different diameters and width dimensions are mixed, reel holding section 6 can easily take out reels R by holding reels R in a state in which the center holes of reels R are aligned. Identification code 63 is displayed near the outer periphery of the upper surface of holding plate 61. Identification code 63 includes information for specifying an individual of reel holding section 6. Identification code 63 is provided by printing or attaching a sticker.

The worker procures multiple reels R based on the work instruction data and performs a stacking work of stacking reels R on reel holding section 6. The work instruction data indicates the work content of the setup work performed by feeder setup device 1. That is, the work instruction data is data in which the type information of multiple reels R sequentially required with the production progress of the component mounter is associated with the type information of multiple tape feeders 9 applicable to reels R.

Reel transfer mechanism 1A is disposed on plate seat 142 extending leftward from a bottom portion of pedestal 14. Reel transfer mechanism 1A functions as a part of reel attachment mechanism 3. Reel transfer mechanism 1A includes support column 1B, arm 1C, and collection section 1E. Support column 1B stands vertically upward from a position near the rear portion of plate seat 142. Arm 1C is provided to be liftable and lowerable with respect to support column 1B. Further, arm 1C is configured to be rotatable in a horizontal plane about rotation shaft 1D provided at a position close to support column 1B.

Collection section 1E is provided to be extendable and contractible with respect to arm 1C. Collection section 1E detachably collects reel R on the lower side thereof. The collection method of collection section 1E may be the same as or different from those of collection section 332 of reel attachment mechanism 3 and collection section 532 of reel removal mechanism 5. Code reader 1F (see FIG. 4) is provided in collection section 1E. Code reader 1F reads identification code 63 of reel holding section 6. Further, code reader 1F can read the identification code of uppermost reel R.

As described above, reel transfer mechanism 1A functions as a part of reel attachment mechanism 3. More specifically, reel transfer mechanism 1A takes out reel R from reel holding section 6 by the operations of arm 1C and collection section 1E. Further, reel transfer mechanism 1A places taken-out reels R in placement area 34 or temporary placement area 35 while maintaining the lying down posture by the operations of arm 1C and collection section 1E. Reel transfer mechanism 1A sequentially uses multiple reels R stacked on reel holding section 6 from the upper side.

Feeder supply section 15 detachably includes feeder accommodation section 7, and further includes feeder conveyance section 75. As illustrated in FIG. 2, storage space 161 in the upper portion of device housing 16 is open forward, and two feeder accommodation sections 7 can be stored side by side in the left-right direction. Multiple roller conveyors 162 (see FIG. 1) extending in the left-right direction are provided on the bottom surface defining storage space 161, thereby facilitating the storage operation of feeder accommodation section 7.

Feeder accommodation section 7 is formed in a box shape with an open front side. Multiple slots having the same shape as slot 22 of feeder holding section 2 are formed on the bottom surface of feeder accommodation section 7. Feeder accommodation section 7 accommodates multiple (for example, 20) tape feeders 9 arranged in the left-right direction in a vertical posture. When multiple tape feeders 9 are accommodated in feeder accommodation section 7 and feeder accommodation section 7 is stored in storage space 161, multiple feeder control sections are communicably connected to main control section 81 described later by automatically fitting a connector (not illustrated). An identification code for identifying individual feeder accommodation section 7 is displayed in each feeder accommodation section 7. The worker procures multiple tape feeders 9 to be used based on the above-described work instruction data, and performs the accommodation work of accommodating tape feeders 9 in feeder accommodation section 7. The number of feeder accommodation sections 7 stored in storage space 161 may be one or three or more.

Guide rail 163 is provided in a front lower portion of storage space 161 of device housing 16. Guide rail 163 extends substantially entirely in the left-right direction of storage space 161, and further extends to the front side of feeder holding section 2. Feeder conveyance section 75 is mounted on guide rail 163. Feeder conveyance section 75 reciprocates between feeder accommodation section 7 and feeder holding section 2 along guide rail 163.

Feeder conveyance section 75 is formed in a box shape having an opening portion on the rear side. Feeder conveyance section 75 includes an accommodation space for temporarily accommodating tape feeder 9 and a feeder operation mechanism for taking tape feeder 9 into and out of the accommodation space via the opening portion. Accordingly, feeder conveyance section 75 can pull out tape feeder 9 from feeder accommodation section 7 or feeder holding section 2, or conversely, can insert tape feeder 9 into feeder accommodation section 7 or feeder holding section 2. It is preferable to provide an openable or closable safety fence (not illustrated) on the front side of reel supply section 13 and feeder supply section 15 to prevent a worker from inadvertently approaching.

2. Configuration for Control and Driving of Feeder Setup Device 1

Figure 4:
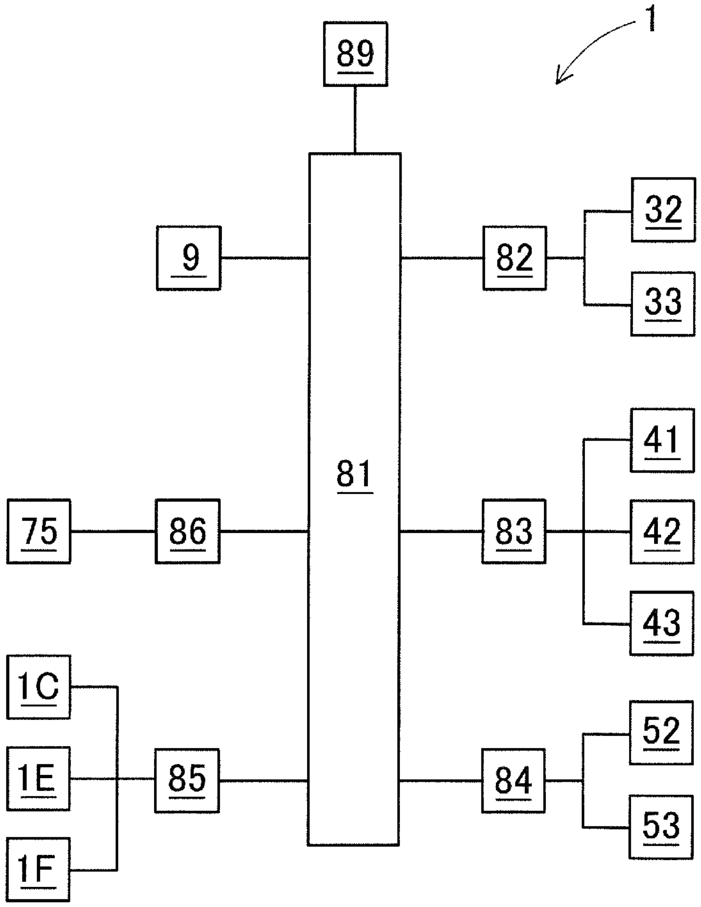
FIG. 4 is a block diagram illustrating a configuration related to control and driving of the feeder setup device.

Next, a configuration related to control and driving of feeder setup device 1 will be described with reference to FIG. 4. Feeder setup device 1 includes main control section 81, attachment control section 82, loading control section 83, removal control section 84, transfer control section 85, and conveyance control section 86. Main control section 81 is configured using a computer device having a communication function and a man-machine interface function. The other control sections corresponding to lower-level control sections may be provided integrally with or separately from main control section 81. FIG. 4 illustrates only one of multiple tape feeders 9 communicably connected to main control section 81.

Main control section 81 is communicably connected to the feeder control section of tape feeder 9 held by feeder holding section 2. Main control section 81 is communicably connected to feeder control sections of multiple tape feeders 9 accommodated in feeder accommodation section 7. Meanwhile, main control section 81 is communicably connected to host control section 89. Host control section 89 stores feeder correspondence data in which the identification code of feeder accommodation section 7 is associated with the identification codes of multiple accommodated tape feeders 9. The feeder correspondence data is created during the above-described accommodation work. In addition, host control section 89 stores reel correspondence data in which the identification code of reel holding section 6 is associated with the identification codes of multiple reels R held. The reel correspondence data is created during the above-described stacking work. Host control section 89 stores feeder information in which the identification code of tape feeder 9 is associated with the tape feeder type information. Host control section 89 stores reel information in which the identification code of reel R is associated with the type information of reel R.

Main control section 81 acquires work instruction data from host control section 89 before starting the setup work. Further, main control section 81 acquires the feeder correspondence data and the reel correspondence data together with the work instruction data. Main control section 81 may include a code reader (such as a two-dimensional code reader) that reads the identification code of feeder accommodation section 7, and may acquire the feeder correspondence data by referring to host control section 89 for the read identification code.

Main control section 81 controls attachment control section 82, loading control section 83, removal control section 84, transfer control section 85, and conveyance control section 86. Here, reel attachment mechanism 3 (including reel transfer mechanism 1A), tape loading mechanism 4, and reel removal mechanism 5 are provided separately, have different drive sources, and operate independently of each other. In accordance with this, main control section 81 operates reel attachment mechanism 3, tape loading mechanism 4, and reel removal mechanism 5 to operate separately in parallel so as to efficiently perform the setup work, and causes reel attachment mechanism 3, tape loading mechanism 4, and reel removal mechanism 5 to avoid interference between the mechanisms.

Attachment control section 82 controls the start and stop of the first motor that drives the movement of moving table 32 of reel attachment mechanism 3, and the change of the movement direction by switching between the forward rotation and the reverse rotation of the first motor. Further, attachment control section 82 controls the swinging operation of attachment material 33 and the collection operation of collection section 332.

Loading control section 83 controls the operations of articulated arm 41 and finger 43 based on the detection result of camera 42 of tape loading mechanism 4. Removal control section 84 controls the start and stop of the second motor that drives the movement of moving table 52 of reel removal mechanism 5, and the change of the movement direction by switching between the forward rotation and the reverse rotation of the second motor. Furthermore, removal control section 84 controls the swinging operation of removal material 53 and the collection operation of collection section 532. Transfer control section 85 controls the lifting/lowering operation and the rotating operation of arm 1C of reel transfer mechanism 1A, and further controls the extending and contracting operation and the collection operation of collection section 1E.

Transfer control section 85 transmits identification code 63 of reel holding section 6 read by code reader 1F to main control section 81. Main control section 81 refers to host control section 89 for the received identification code 63, acquires the reel correspondence data, and identifies the individual of all reels R of reel holding section 6. Alternatively, code reader 1F may subsequently acquire the identification codes displayed on reels R, and the acquired identification codes may be transmitted from transfer control section 85 to main control section 81. Conveyance control section 86 controls start and stop of a third motor that drives the movement of feeder conveyance section 75 and the change of the movement direction by switching between the forward rotation and the reverse rotation of the third motor.

Main control section 81 acquires the work instruction data, the feeder information, and the reel information from host control section 89, acquires the identification code of tape feeder 9 held in feeder holding section 2, and acquires the identification code of reel holding section 6 or the identification code of reel R from transfer control section 85. Further, main control section 81 can select tape feeder 9 applicable to uppermost reel R of reel holding section 6 based on the work instruction data, the feeder information, the reel information, and the identification code. That is, main control section 81 selects tape feeder 9 of the type corresponding to the type of reel R based on the recognized identification information of reel R and the identification information of the tape feeder.

3. Operation of Feeder Setup Device 1

Figure 5:
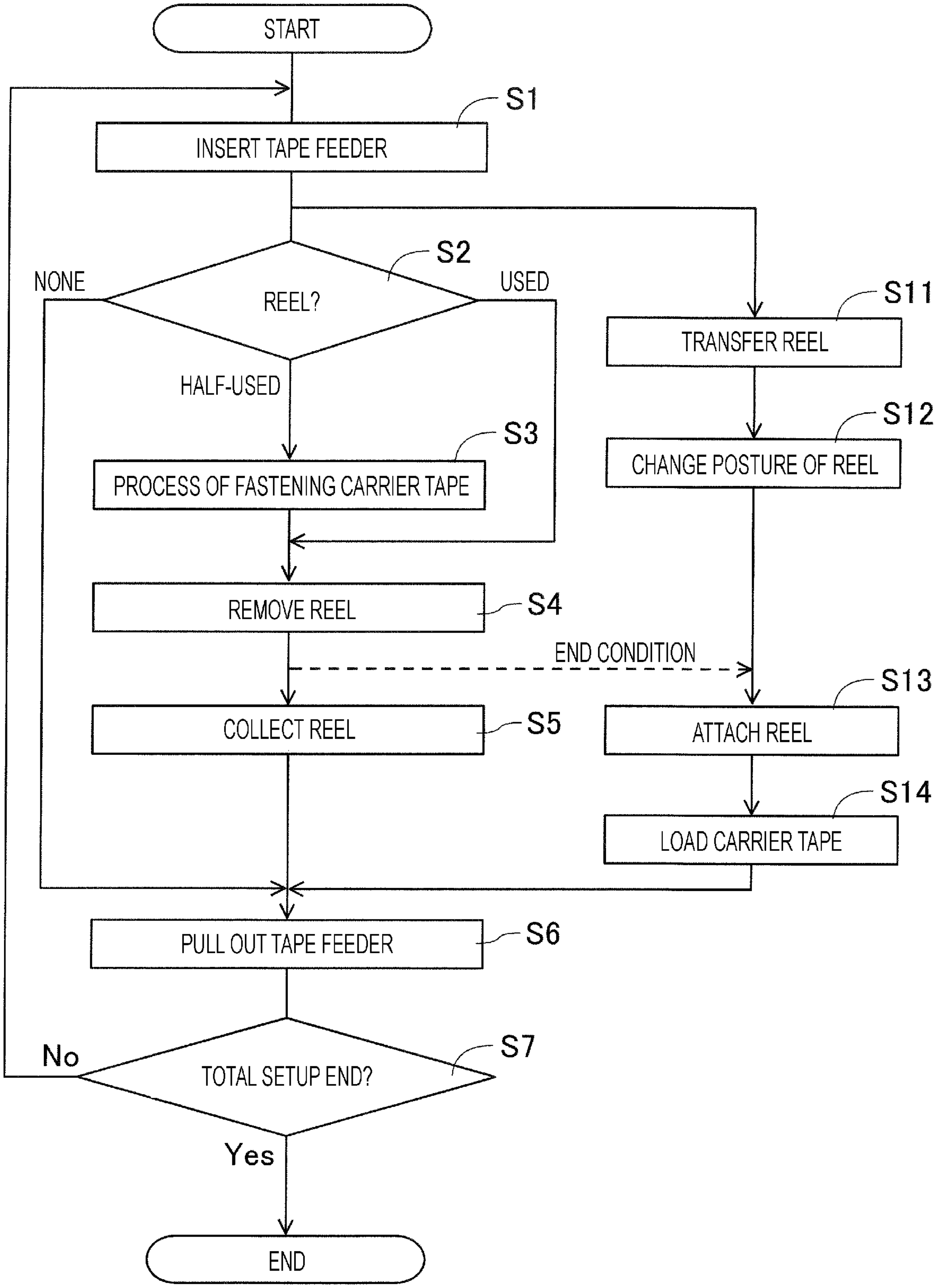
FIG. 5 is a flowchart illustrating an operation of the feeder setup device.

Next, the operation of feeder setup device 1 will be described with reference to FIGS. 5 to 7. Since multiple mechanisms operate in parallel in feeder setup device 1, the operation flow becomes two parallel series as illustrated in FIG. 5. This operation flow proceeds through cooperative control of main control section 81 mainly with lower-level control section.

Prior to the execution of the operation flow of FIG. 5, the worker stores first feeder accommodation section 7 accommodating multiple tape feeders 9 which are setup work targets in storage space 161. Further, the worker stores empty second feeder accommodation section 7 in storage space 161. According to this, an operation is to collect setup completed tape feeders 9 in second feeder accommodation section 7, and finally empty first feeder accommodation section 7.

This configuration is not limited to the above, and the operation may be to use only one feeder accommodation section 7 and return tape feeder 9 for which the setup work is completed to the original accommodation position. Further, an operation may be to accommodate tape feeders 9 in the two feeder accommodation sections 7 without a gap, and perform the setup work for the maximum number. In this operation, when the setup work for first feeder accommodation section 7 is completed and the setup work for second feeder accommodation section 7 is performed, first feeder accommodation section 7 for which the work has been performed can be exchanged with third feeder accommodation section 7 before the work is performed. By repeating this, the setup work can be performed without interruption.

The worker further places reel holding section 6 holding multiple reels R used for the setup work on pedestal 14 of reel supply section 13. At this time, it is preferable that multiple tape feeders 9 accommodated in feeder accommodation section 7 and multiple reels R held by reel holding section 6 correspond to each other in a one-to-one manner without excess or deficiency. When the worker performs the accommodation work and the stacking work described above based on the work instruction data, the one-to-one correspondence relationship is satisfied and there is no excess or deficiency. The one-to-one correspondence relationship is satisfied even in a case where multiple types of tape feeders 9 and multiple types of reels R are mixed.

In Step S1 of FIG. 5, main control section 81 causes feeder conveyance section 75 to convey tape feeder 9 corresponding to uppermost reel R of reel holding section 6. Feeder conveyance section 75 pulls out and accommodates tape feeder 9 from feeder accommodation section 7, moves to feeder holding section 2 (see arrow M1 in FIG. 6), and inserts accommodated tape feeder 9 into feeder holding section 2. Accordingly, tape feeder 9 is held at the work execution position, and the identification code is read by main control section 81.

In a case of an exception where there is no tape feeder 9 applicable to uppermost reel R, uppermost reel R is placed in temporary placement area 35 by reel transfer mechanism 1A, and tape feeder 9 corresponding to second reel R is inserted into feeder holding section 2. This exception occurs, for example, when the worker pulls out tape feeder 9 from feeder accommodation section 7 for some reason. Thereafter, the operation flow is divided into a first series of Steps S2 to S5 and a second series of Steps S11 to S14.

In Step S2 of the first series, main control section 81 checks the state of reel R of tape feeder 9 based on the identification code of tape feeder 9 or the identification code of reel R read from the feeder control section, and branches the operation flow. When tape feeder 9 is used in the component mounter in advance, reel R may be in a half-used state in which a part of carrier tape T is used. In Step S3 in this case, tape loading mechanism 4 performs a process of fastening the distal end of carrier tape T with a fastening tape to suppress slack of carrier tape T. At this time, tape loading mechanism 4 can wind carrier tape T around reel R as necessary. Thereafter, tape loading mechanism 4 takes a retracted posture in which articulated arm 41 is bent.

In next Step S4, reel removal mechanism 5 removes reel R from tape feeder 9. Specifically, first, moving table 52 moves from the standby position to feeder holding section 2 (see arrow M2 in FIG. 6). Next, when removal material 53 swings from the horizontal posture to the vertical posture, collection section 532 comes into contact with reel R and collects reel R. Next, when removal material 53 returns from the vertical posture to the horizontal posture, collection section 532 pulls out reel R from reel holding shaft 91 and holds reel R in the horizontal posture. At this time, main control section 81 deletes the identification code of reel R from the storage section of the feeder control section of tape feeder 9. Further, main control section 81 transmits the identification code of tape feeder 9 from which reel R is actually removed to host control section 89. At this time, main control section 81 may transmit the identification code of the removed reel R together with the identification code of tape feeder 9 to host control section 89.

In next Step S5, reel removal mechanism 5 collects reel R. Specifically, first, moving table 52 moves from feeder holding section 2 to the standby position (see arrow M4 in FIG. 7). Next, collection section 532 releases reel R. Accordingly, released reel R automatically falls into collection box 54. Thereafter, the operation flow proceeds to Step S6 and waits until the operation of the second series ends.

Further, in Step S2, reel R may have been used in a state where the entire carrier tape T has been used. In this case, the operation flow omits Step S3 and proceeds to Step S4, and reel R is immediately removed. Further, in Step S2, there is a case where reel R is not originally attached to tape feeder 9 (case of no reel). In this case, the operation flow immediately proceeds to Step S6.

Figure 6:
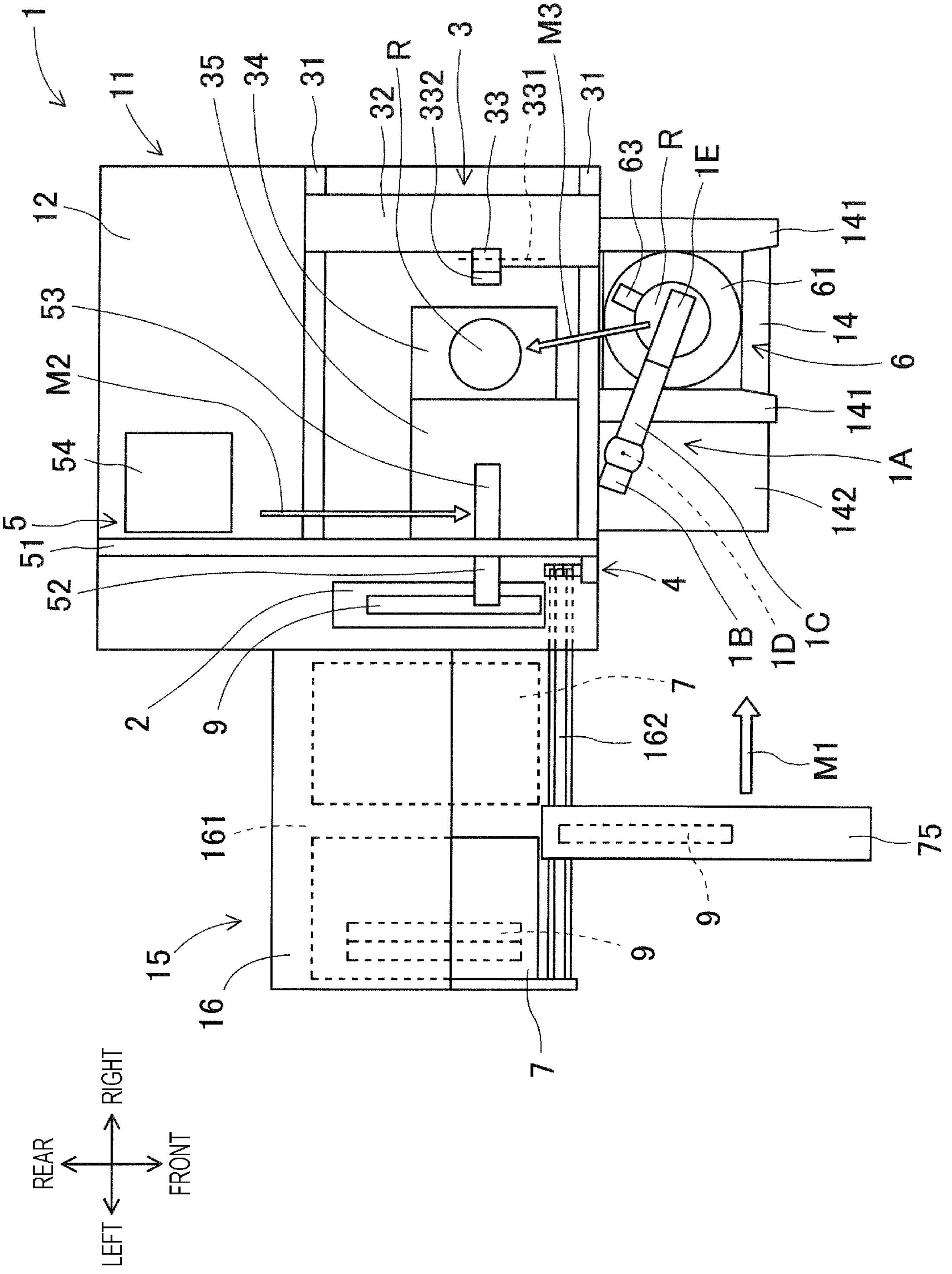
FIG. 6 is a plan view illustrating an operation of removing the reel from the tape feeder and another reel preparation operation to be performed in parallel.
Figure 7:
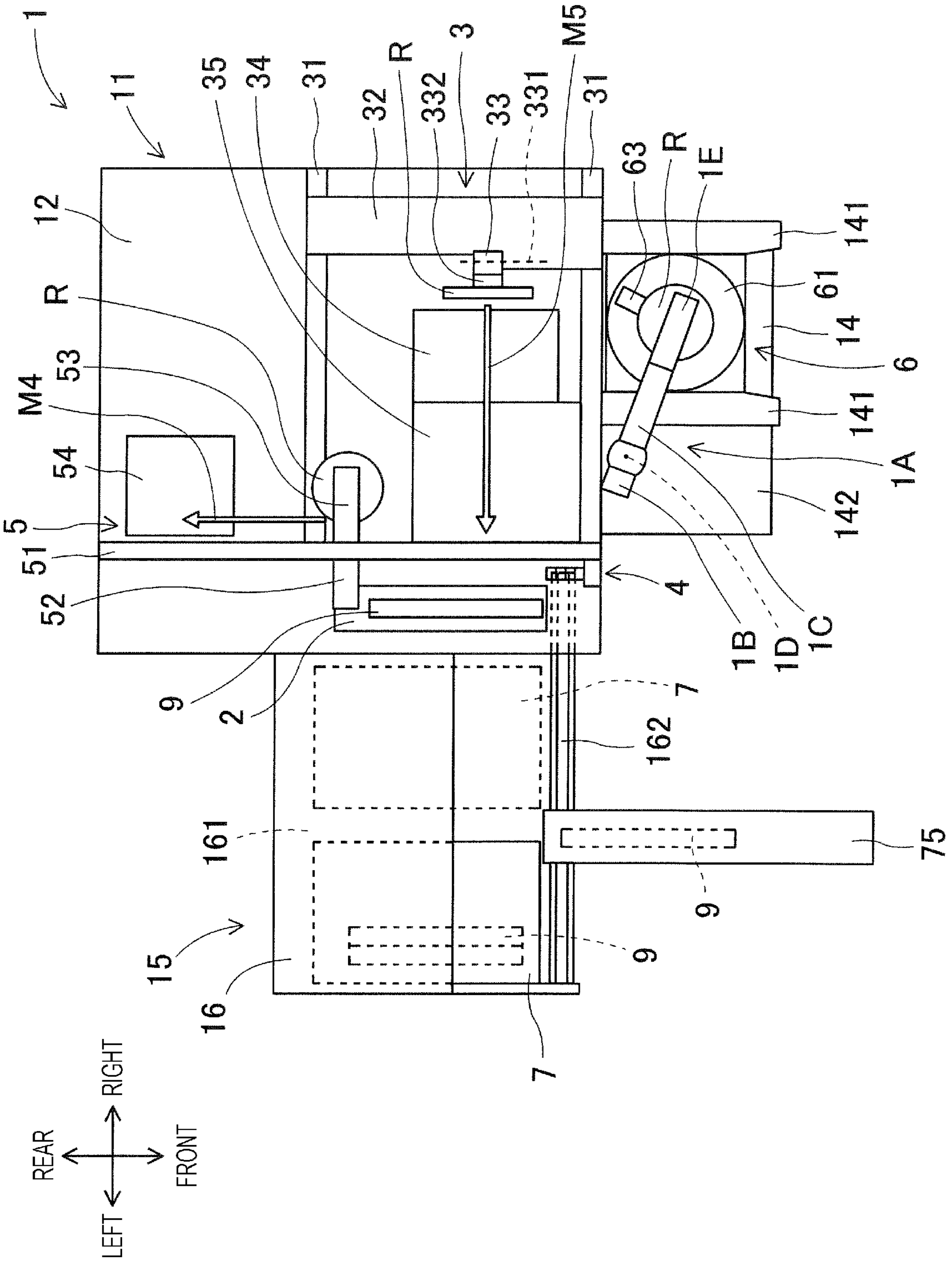
FIG. 7 is a plan view illustrating a collection operation of the removed reel and an attachment operation of another reel performed in parallel.

Meanwhile, in Step S11 of the second series, reel transfer mechanism 1A collects uppermost reel R on reel holding section 6 using collection section 1E, and places reel R on placement area 34 (see arrow M3 in FIG. 6). In a case of an exception where uppermost reel R is placed in temporary placement area 35, reel transfer mechanism 1A places second reel R in placement area 34. Thereafter, reel transfer mechanism 1A returns collection section 1E to above reel holding section 6.

In next Step S12, reel attachment mechanism 3 changes the posture of reels R in placement area 34. Specifically, first, when attachment material 33 falls down from the upright posture to the horizontal posture, collection section 332 comes into contact with reel R and collects reel R. At this time, since reel R is in the lying down posture, the placed position and posture of reel R are stabilized. Accordingly, collection section 332 can easily collect reel R. When reel R is in the vertical posture, reel R may roll or change the direction.

Next, when attachment material 33 returns from the horizontal posture to the upright posture, collection section 332 changes reel R from the lying down posture to the vertical posture and holds reel R. When reels R in temporary placement area 35 are used, moving table 32 moves leftward by a predetermined distance before attachment material 33 falls down. Thereafter, the execution of the operation flow is suspended until an end condition indicating the end of Step S4 is satisfied. This is to avoid interference between reel attachment mechanism 3 and reel removal mechanism 5.

In Step S13 after the end condition is satisfied, reel attachment mechanism 3 attaches reel R to tape feeder 9. More specifically, moving table 32 moves to feeder holding section 2 in a state in which collection section 332 holds reel R in the vertical posture. Accordingly, reel R moves forward straight toward reel holding shaft 91 (see arrow M5 in FIG. 7) and is automatically attached to reel holding shaft 91. The movement of moving table 32 can be performed simultaneously with the movement of moving table 52 to the standby position.

When the attachment of reel R is completed, main control section 81 stores the identification code of reel R in the feeder control section of tape feeder 9. Further, main control section 81 transmits the identification code of tape feeder 9 and the identification code of reel R actually that are combined to host control section 89 in association with each other. Thereafter, moving table 32 returns to the standby position. In next Step S14, tape loading mechanism 4 peels off the fastening tape at the distal end of carrier tape T and loads carrier tape T until carrier tape T engages with sprocket 94.

In Step S6 executed after Step S14, feeder conveyance section 75 pulls out tape feeder 9 from feeder holding section 2, accommodates tape feeder 9, moves to feeder accommodation section 7, and inserts accommodated tape feeder 9 into feeder accommodation section 7. Thus, the setup work for one tape feeder 9 is completed. In next Step S7, main control section 81 determines whether the setup work for all tape feeders 9 is completed. When not, the operation flow returns to Step S1, and the setup work for next tape feeder 9 is repeated. When the setup work for all tape feeders 9 ends, the operation flow ends.

Thereafter, the worker conveys feeder accommodation section 7 accommodating setup completed tape feeder 9 to the component mounter, and performs the setup change of tape feeder 9. In a case where reel R is temporarily placed in temporary placement area 35, the reel is used when the worker accommodates tape feeder 9 applicable to reel R in the feeder accommodation section 7. Further, reel R left unused in temporary placement area 35 is returned to reel holding section 6 by reel transfer mechanism 1A and collected by the worker. In the present embodiment, when the worker first prepares feeder accommodation section 7 and reel holding section 6, the setup work of multiple tape feeders 9 is automatically performed, and thus, the effect of labor saving is remarkable.

Figure 8:
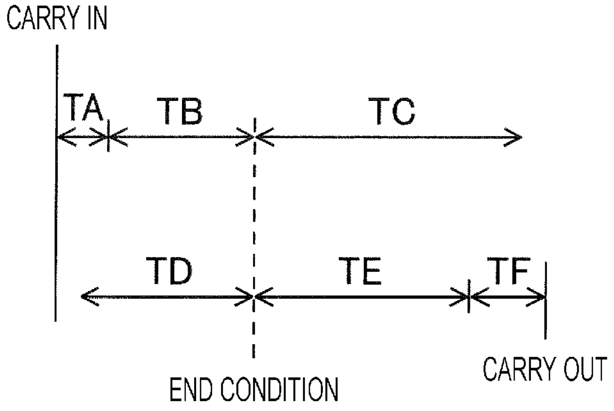
FIG. 8 is a diagram illustrating a setup time in the feeder setup device.

The setup time in the present embodiment is illustrated in FIG. 8. In FIG. 8, required time TA of the fastening process of carrier tape T, required time TB of the removal of reel R, required time TC of the collection of reel R, required time TD of the preparation (transfer and posture change) of another reel R, required time TE of the attachment of another reel R, and required time TF of the loading of carrier tape T are illustrated. Further, "carry-in" means insertion of tape feeder 9 into feeder holding section 2, and "carry-out" means pulling out of tape feeder 9 from feeder holding section 2.

In the present embodiment, there is a restriction that the end condition of Step S4, that is, the attachment of another reel R (required time TE) is started after the removal of reel R (required time TB) ends. Also in this case, as illustrated in the drawing, the fastening process of carrier tape T (required time TA) and the removal of reel R (required time TB) can be performed in parallel with the preparation of another reel R (required time TD). Further, the collection of reel R (required time TC) can be performed in parallel with the attachment of another reel R (required time TE) and the loading of carrier tape T (required time TF).

Figure 9:
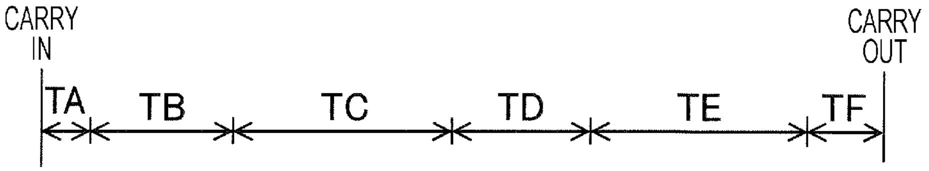
FIG. 9 is a diagram illustrating a setup time in the conventional art.

Meanwhile, in the configuration including one robot section exemplified in Patent Literature 1, as illustrated in FIG. 9, processes of the setup work are sequentially performed, and thus, cannot be performed in parallel with each other. According to the present embodiment, the setup time from the carry-in to the carry-out of tape feeder 9 can be significantly reduced as compared with the conventional art.

In feeder setup device 1 of the embodiment, reel attachment mechanism 3 performs a setup work of changing reel R from the lying down posture to the vertical posture and attaching reel R to tape feeder 9. Accordingly, reel attachment mechanism 3 can attach reel R held in the lying down posture by reel holding section 6 to tape feeder 9 held in the vertical posture by feeder holding section 2. At this time, it is possible to easily collect reel R whose position and posture are stabilized because the reel is in the lying down posture, and thus feeder setup device 1 can efficiently perform the setup work. Further, since tape feeder 9 is set up in the vertical posture as in the case where tape feeder 9 is used in the component mounter, it is not necessary to change the posture when tape feeder 9 after the setup is conveyed by the worker or the automation device and tape feeder 9 is attached to the component mounter by the worker or the automation device. Accordingly, the worker or the automation device can efficiently perform work.

When reel R is stored in a vertical posture in a storage box opened upward to prevent reel R from rolling, it is difficult to take out reel R. In particular, when reels R having different diameters and width dimensions are mixed, it becomes more difficult to take out reels R. Further, in Patent Literature 1, tape feeder 9 is in the lying down posture, and thus, there is a concern that a component may fall off after half-used carrier tape T is loaded. In contrast, in the present embodiment, since the setup work of tape feeder 9 is performed in the same vertical posture as that in use, the vicinity of the peeled distal end of carrier tape T is substantially in the horizontal posture at supply position 93, and thus, falling off of the component is suppressed.

4. Modified Embodiment

Figure 10:
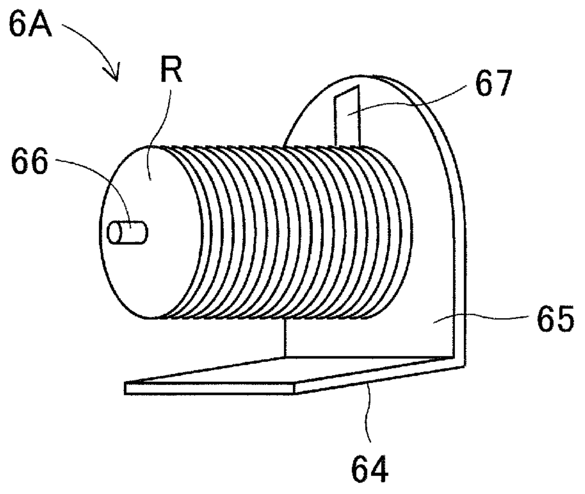
FIG. 10 is a perspective view schematically illustrating a reel holding section of a modified embodiment.

Next, a modified embodiment in which the shape of reel holding section 6A is different will be described with reference to FIG. 10. Reel holding section 6A of the modified embodiment includes bottom plate 64, holding plate 65, and holding shaft 66. Bottom plate 64 is a portion to be placed on pedestal 14, and is formed in a wide rectangular shape for stabilization. Holding plate 65 is provided upright from one side of bottom plate 64. Holding shaft 66 is provided upright in the vertical direction from holding plate 65 and extends in the horizontal direction above bottom plate 64. Holding shaft 66 is fitted into the center holes of multiple reels R, in other words, holds multiple reels R arranged in a vertical posture. Identification code 67 is displayed near the outer edge of holding plate 65.

In the modified embodiment, collection section 1E of reel transfer mechanism 1A is deformed into the upright posture, and collects reel R from reel holding section 6A while maintaining reel R in the vertical posture. Further, collection section 1E transfers reel R to collection section 332 of reel attachment mechanism 3 in the air while maintaining reel R in the vertical posture. The configurations and operations of the other portions in the modified embodiment are substantially the same as those in the embodiment. Also in the modified embodiment, the setup work can be efficiently performed as in the embodiment.

5. Feeder Setup System 1S of Embodiment

Next, feeder setup system 1S of the embodiment will be described with reference to FIGS. 11 to 13. Feeder setup system 1S is configured by adding feeder conveyance vehicle 9A and reel conveyance vehicle 9C to feeder setup device 1. As illustrated in FIG. 12, feeder conveyance vehicle 9A travels in a state of loading feeder accommodation section 7. Feeder conveyance vehicle 9A has roller device 9B for reloading feeder accommodation section 7 on an upper surface of feeder conveyance vehicle 9A. Feeder conveyance vehicle 9A travels in accordance with radio command 9G from conveyance control section 9F, and performs the reloading work. Feeder conveyance vehicle 9A and reel conveyance vehicle 9C are automated guided vehicles called AGV.

Figure 13:
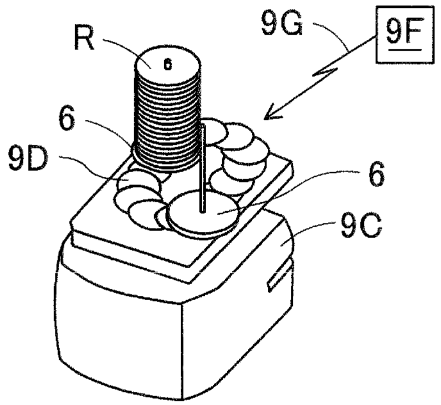
FIG. 13 is a perspective view of a reel conveyance vehicle that conveys the reel holding section.

As illustrated in FIG. 13, reel conveyance vehicle 9C travels with multiple reel holding sections 6 loaded thereon. In the example of FIG. 13, one reel holding section 6 fully loads reels R, and other reel holding sections 6 are empty. Reel conveyance vehicle 9C includes, on the upper surface thereof, annular conveyor device 9D that adjusts the position of reel holding section 6 to automate the reloading. Reel conveyance vehicle 9C travels in accordance with radio command 9G from conveyance control section 9F and performs the reloading work. Note that reel conveyance vehicle 9C may be a small-sized vehicle that travels with one reel holding section 6 loaded thereon.

Figure 11:
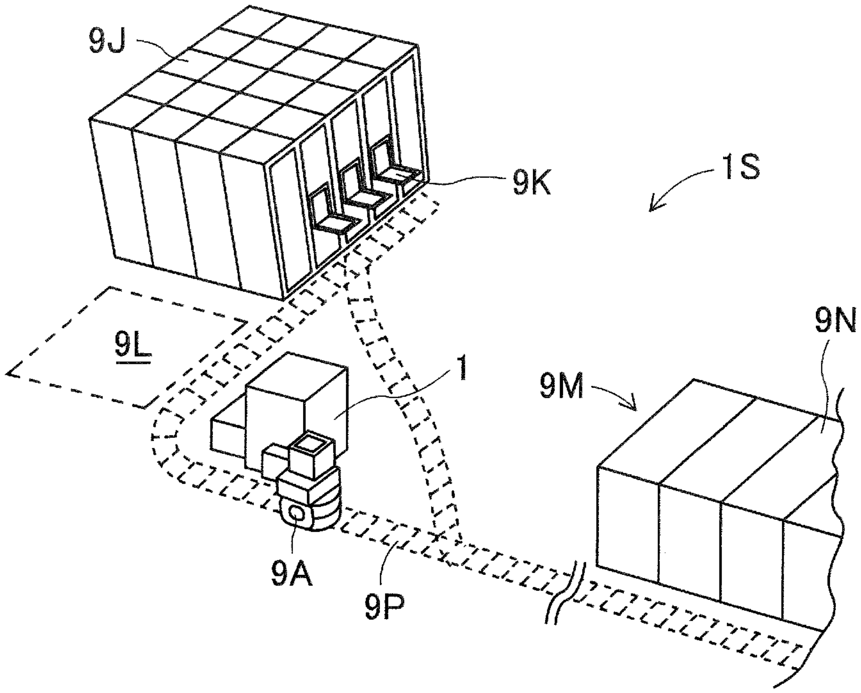
FIG. 11 is a perspective view schematically illustrating a feeder setup system according to an embodiment.
Figure 12:
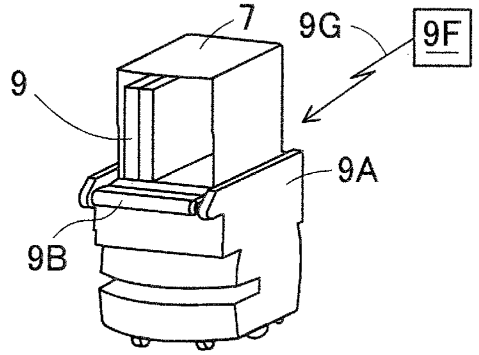
FIG. 12 is a perspective view of a feeder conveyance vehicle that conveys a feeder accommodation section.

As illustrated in FIG. 11, travel target locations of feeder conveyance vehicle 9A and reel conveyance vehicle 9C are four locations of feeder setup device 1, entrance/exit 9K of warehouse 9J, external setup area 9L, and component mounter 9N constituting board working line 9M. Warehouse 9J receives, stores, and takes out an instrument such as tape feeder 9 and members such as reel R. External setup area 9L is an area in which a worker performs various setup works related to board working line 9M. No safety fence is provided in front of reel supply section 13 and feeder supply section 15 of feeder setup device 1. Feeder conveyance vehicle 9A and reel conveyance vehicle 9C travel along travel path 9P between the four travel target locations. Travel path 9P is not limited to an entity such as a rail, and may be virtually set on a floor surface.

Next, an example of conveyance by feeder conveyance vehicle 9A and reel conveyance vehicle 9C will be described. Feeder conveyance vehicle 9A takes out multiple tape feeders 9 in a single item state from warehouse 9J and conveys tape feeders 9 to external setup area 9L. Reel conveyance vehicle 9C takes out multiple reels R in a single item state from warehouse 9J and conveys reels R to external setup area 9L. In external setup area 9L, the worker performs an accommodation work of accommodating multiple tape feeders 9 in feeder accommodation section 7. Further, the worker performs a stacking work of stacking multiple reels R on reel holding section 6.

Next, feeder conveyance vehicle 9A conveys feeder accommodation section 7 set up in external setup area 9L to feeder setup device 1 and stores feeder accommodation section 7 in storage space 161 of feeder supply section 15. Further, reel conveyance vehicle 9C conveys reel holding section 6, which has been set up in external setup area 9L, to feeder setup device 1 and places reel holding section 6 on pedestal 14 of reel supply section 13. At this time, main control section 81 of feeder setup device 1 and conveyance control section 9F cooperate to control the carry-in of feeder accommodation section 7 and reel holding section 6.

Accordingly, feeder accommodation section 7 to be carried in does not collide with feeder conveyance section 75, and another feeder accommodation section 7 is not already present at the scheduled carry-in position. When reel conveyance vehicle 9C arrives at feeder setup device 1, empty reel holding section 6 may remain on pedestal 14. In this case, reel conveyance vehicle 9C first carries out empty reel holding section 6 from pedestal 14, and places reel holding section 6 that has been conveyed next on pedestal 14.

As a result, feeder setup device 1 is ready for operation and executes setup work of multiple tape feeders 9. Reel holding section 6 becomes empty with no reel R by the execution of the setup work. Reel conveyance vehicle 9C carries out empty reel holding section 6 and conveys reel holding section 6 to external setup area 9L.

Meanwhile, feeder conveyance vehicle 9A carries out feeder accommodation section 7 accommodating setup completed tape feeder 9 and conveys feeder accommodation section 7 to the vicinity of component mounter 9N. The worker removes tape feeder 9 not used for the next production from component mounter 9N, and performs a setup change work of attaching tape feeder 9 to be used for the next production in feeder accommodation section 7 to component mounter 9N. Removed tape feeder 9 is accommodated in feeder accommodation section 7. Feeder conveyance vehicle 9A conveys feeder accommodation section 7 to feeder setup device 1 so that reel R of tape feeder 9 can be exchanged. Alternatively, feeder conveyance vehicle 9A conveys feeder accommodation section 7 to external setup area 9L.

A conveyance operation other than the above-described operations is also possible. For example, feeder conveyance vehicle 9A may deliver tape feeder 9 that is not scheduled to be used to warehouse 9J, and reel conveyance vehicle 9C may deliver half-used reel R to warehouse 9J. Further, one conveyance vehicle may be used as both feeder conveyance vehicle 9A and reel conveyance vehicle 9C. Further, feeder conveyance vehicle 9A and reel conveyance vehicle 9C may also be used for conveying various instruments and members used in board working line 9M. Conversely, a part of the above-described conveyance operation may be performed by the worker, or one of feeder conveyance vehicle 9A and reel conveyance vehicle 9C may be omitted.

In feeder setup system 1S of the embodiment, feeder accommodation section 7 and reel holding section 6 are automatically carried into and out of feeder setup device 1. Accordingly, the effect of labor saving is further enhanced by adding feeder conveyance vehicle 9A and reel conveyance vehicle 9C to feeder setup device 1.

6. Application and Modification of Embodiment

The minimum configuration of the feeder setup device is a configuration in which reel supply section 13, feeder supply section 15, and tape loading mechanism 4 are omitted from the configuration of the embodiment. In the minimum configuration, the worker inserts tape feeder 9 into feeder holding section 2, and places reel R in placement area 34 in the lying down posture. Thus, reel R is automatically attached to tape feeder 9. The worker takes out tape feeder 9 to which reel R is attached, loads carrier tape T, and ends the setup work.

Tape loading mechanism 4 can perform a more complicated loading operation than that described above. For example, in new reel R, a guide tape is added to the distal end of carrier tape T. When new reel R is attached to tape feeder 9, tape loading mechanism 4 can cut the guide tape at a predetermined position and load the guide tape until the cut end engages with sprocket 94. Further, reel holding section 6 may be disposed instead of collection box 54, removed reel R may be collected in reel holding section 6, and reel conveyance vehicle 9C may carry out reel holding section 6. In addition, the embodiment can be applied or modified in various manners.

REFERENCE SIGNS LIST

1: feeder setup device, 11: reel attachment/detachment section, 13: reel supply section, 15: feeder supply section, 1A: reel transfer mechanism, 1B: support column, 1C: arm, 1E: collection section, 1S: feeder setup system, 2: feeder holding section, 3: reel attachment mechanism, 31: guide rail, 32: moving table, 33: attachment material, 332: collection section, 34: placement area, 35: temporary placement area, 4: tape loading mechanism, 41: articulated arm, 42: camera, 43: finger, 5: reel removal mechanism, 51: guide rail, 52: moving table, 53: removal material, 532: collection section, 54: collection box, 6, 6A: reel holding section, 61: holding plate, 62: holding shaft, 64: bottom plate, 65: holding plate, 66: holding shaft, 7: feeder accommodation section, 75: feeder conveyance section, 81: main control section, 89: host control section, 9: tape feeder, 91: reel holding shaft, 94: sprocket, 9A: feeder conveyance vehicle, 9C: reel conveyance vehicle, 9F: conveyance control section, R: reel, T: carrier tape

The invention claimed is:

1. A feeder setup device comprising:

a feeder holding section configured to hold, at a work execution position in a vertical posture, a tape feeder to which a reel around which a carrier tape is wound is attached, the tape feeder being configured to feed the carrier tape to supply a component;

a reel holding section configured to hold the reel in a lying down posture; and a reel attachment mechanism configured to take out the reel from the reel holding section, change the reel to the vertical posture, and attach the reel to the tape feeder at the work execution position, wherein the reel attachment mechanism includes a reel transfer mechanism that removes the reel from the reel holding section, an attachment member that takes the reel transferred by the reel transfer mechanism and changes the reel to the vertical posture, and a moving table that moves the attachment member to the work execution position.

2. The feeder setup device according to claim 1, further comprising:

a feeder accommodation section configured to accommodate multiple tape feeders in the vertical posture; and a feeder conveyance section configured to convey the tape feeder between the feeder accommodation section and the feeder holding section.

3. The feeder setup device according to claim 1, wherein the reel holding section stacks and holds multiple reels in the lying down posture, and the reel attachment mechanism uses the multiple reels stacked on the reel holding section in order from an upper side.

4. The feeder setup device according to claim 3, wherein the reel holding section includes a holding plate that is horizontally disposed, and a holding shaft that is provided upright upward from the holding plate and is fitted into a center hole formed at a center of the reel.

5. The feeder setup device according to claim 3, wherein the reel attachment mechanism has a temporary placement area in which the reel taken out from the reel holding section is temporarily placed and a use order is changed later when the use order of the reels is changed.

6. The feeder setup device according to claim 1, further comprising a reel removal mechanism configured to remove the reel from the tape feeder at the work execution position.

7. The feeder setup device according to claim 6, wherein the reel attachment mechanism and the reel removal mechanism are operable independently of each other.

8. A feeder setup device comprising:

a feeder holding section configured to hold, at a work execution position in a vertical posture, a tape feeder to which a reel around which a carrier tape is wound is attached, the tape feeder being configured to feed the carrier tape to supply a component;

a reel holding section configured to hold the reel in a lying down posture;

a reel attachment mechanism configured to take out the reel from the reel holding section, change the reel to the vertical posture, and attach the reel to the tape feeder at the work execution position; and a tape loading mechanism configured to load the carrier tape in the tape feeder so that the carrier tape can be fed.

9. The feeder setup device according to claim 8, wherein the reel attachment mechanism and the tape loading mechanism are operable independently of each other.

10. A feeder setup device comprising:

a feeder holding section configured to hold, at a work execution position in a vertical posture, a tape feeder to which a reel around which a carrier tape is wound is attached, the tape feeder being configured to feed the carrier tape to supply a component;

a feeder accommodation section configured to accommodate multiple tape feeders in the vertical posture and detachably provided in a device housing;

a feeder conveyance section configured to convey the tape feeder between the feeder accommodation section and the feeder holding section;

a reel holding section configured to stack and hold multiple reels in a lying down posture and detachably provided in the device housing; and a reel attachment mechanism configured to take out the reel from the reel holding section, change the reel to the vertical posture, and attach the reel to the tape feeder at the work execution position.

11. A feeder setup system comprising:

the feeder setup device according to claim 10; and a conveyance vehicle configured to carry at least one of the feeder accommodation section and the reel holding section into the feeder setup device or carry out at least one of the feeder accommodation section and the reel holding section from the feeder setup device.

12. The feeder setup device according to claim 1, further comprising:

a pair of guide rails extending in a first direction, wherein the moving table reciprocates between a standby position and the work execution position along the pair of guide rails.

* * * * *